United States Patent
Miura et al.

[11] Patent Number: 5,892,965
[45] Date of Patent: Apr. 6, 1999

[54] PIPELINE PROCESSING METHOD AND DEVICE FOR INSTRUCTION EXECUTION

[75] Inventors: Hiroki Miura, Watabi; Yasuhito Koumura, Tokyo; Kenshi Matsumoto, Koshigaya, all of Japan

[73] Assignee: Sanyo Electric Co., Ltd., Osaka, Japan

[21] Appl. No.: 806,221

[22] Filed: Feb. 25, 1997

[30] Foreign Application Priority Data

Feb. 29, 1996 [JP] Japan .................................. 8-042725

[51] Int. Cl.[6] .................................................. G06F 9/38
[52] U.S. Cl. .................. 395/800.34; 395/800.01
[58] Field of Search ................. 395/800.34, 800.33, 395/800.09, 800.01, 800.23, 800.24

[56] References Cited

U.S. PATENT DOCUMENTS 5,187,800  2/1993  Sutherland .......................... 395/800.18
5,572,690  11/1996  Molnar ..................................... 395/376
5,600,848  2/1997  Sproull .............................. 395/800.42
5,704,054  12/1997  Bhattacharya .......................... 395/388

OTHER PUBLICATIONS

NEC Technology Report vol. 48, No. Mar. 1995, pp. 42–47.

Primary Examiner—Eric Coleman
Attorney, Agent, or Firm—Loeb & Loeb LLP

[57] ABSTRACT

A second execution unit such as a coprocessor incorporated into a processor is connected such that the direction of its processing flow is opposite to that of the main pipeline processing flow, and executes high-speed multiplication operations and specific operations. Conventionally, the second execution unit has been provided in the same direction as a first execution unit. With this prior art arrangement, the second execution unit is initiated at an early stage of pipeline processing. With the arrangement of this invention, the second execution unit is initiated at a later stage, giving sufficient time before all the operation data are prepared. Thus, it is unnecessary for the apparatus to start subsequent processing until all operation data become available, thereby enhancing processing performance.

20 Claims, 7 Drawing Sheets

PIPELINE PROCESSING METHOD AND DEVICE FOR INSTRUCTION EXECUTION

BACKGROUND OF THE INVENTION

1. Field of the Invention

The present invention relates to a method for executing instructions through pipeline processing and to a device therefor. In this method, a subpath is provided in the manner of detouring around a part of a main path for pipeline processing and assumes parts of the processes in the main path. This invention has possible applications in microprocessors having a coprocessor for example.

2. Description of the Prior Art

A single-chip RISC (Reduced Instruction Set Computer) is a device for simultaneously realizing high processing performance, low power consumption, and a small mounting area, primarily in specific applications including image processing. Recently, a dedicated arithmetic logic circuit has often been provided in this type of microprocessor to further enhance the arithmetic performance.

One example of this type of microprocessor is the V851 produced by NEC, Ltd. According to NEC Technology Report (Vol. 48, No. 3/1995, pages 42–47), the V851 adopts a pipeline RISC architecture that includes, in addition to an ordinary ALU, a hardware multiplier unit called an MULU for high speed execution of multiplication instructions.

FIG. 1 shows the internal organization of the V851. This diagram is made based on the schematic diagram in page 45 of the above document. As shown in the diagram, this microprocessor comprises an instruction memory 100 for storing instructions to be executed; an instruction fetch unit 101 for sequentially reading instructions; an instruction decoder 102 for decoding read instructions; general-purpose register group 103 to be accessed based on a general register number identified from a decoded result; a first execution unit 106 for receiving one or two source operand read from a general-purpose register via buses 114 and 115 and executing general operations (hereinafter "general execution") according to the decoded result; a memory access unit 108 for reading data necessary for a process from data memory 107 according to the result of the operation execution or writing data of a processed result into data memory 107; and a general-purpose register write unit 109 for receiving data read from data memory 107 via bus 116 and writing them into a predetermined register in general-purpose register group 103.

The above units together constitute a main path for pipeline processing. FIG. 1 also shows a bus 112 leading from memory access unit 108 to the input side of first execution unit 106, and a bus 113 leading from the output side of first execution unit 106 to the input side thereof. These buses 112 and 113 are necessary for achieving "a data forwarding" (described later).

In addition to the above, another path (hereinafter "subpath") is provided, detouring around a part of the main path. On this path, a second execution unit 110 (corresponding to MULU) is provided. A second execution unit 110, which is dedicated to multiplication operations, assumes the processes to be executed by the first execution unit 106 when a multiplication instruction is decoded. Pipeline processing flows from top to bottom along both of the main path and the subpath in FIG. 1.

Pipeline processing is executed through process units each called a stage. Each stage is processed in a constant time period determined according to an operation clock of a microprocessor. Many microprocessors, including the V851, execute instructions by dividing them into five stages outlined below. Each stage is named as follows, but this nomenclature is only for convenience.

1. I stage

Instructions are fetched (read) by instruction fetch unit 101 (see FIG. 1).

2. R stage

Instructions are decoded by instruction decoder 102. A read operation from general-purpose registers is concurrently executed here.

3. A stage

First execution unit 106 (ALU) executes general operations. Multiplication operations are executed by second execution unit 110 (MULU). A memory address is generated for use in the following stage.

4. M stage

Memory access unit 108 accesses data memory 107.

5. W stage

General-purpose register write unit 109 writes data which has been read into a general-purpose register.

For the V851, each of the above stages is generally completed within one cycle (one clock) except for multiplication operations by MULU, which requires two cycles to complete.

FIG. 2 shows a state of pipeline processing by a general microprocessor having the organization shown in FIG. 1. Four instructions LD, LD, MUL, and ST are necessary to write a product of two data stored in data memory 107 back into the memory 107. In this diagram, any instruction XX follows ST instruction. With the initial instruction

LD R1. (R8), data stored at address R8 in data memory 107 is read and transferred to register R1 in general-purpose register group 103. Similarly, with the following instruction, data stored at address R9 is transferred to register R2. With the third MUL instruction, data in registers R1 and R2 are multiplied with each other, and the result is stored in register R1. Finally, with ST instruction, data in register R1 is stored at address. R10 in data memory 107.

FIG. 2 shows a state where respective instructions are executed through five stages. At M stage of the first instruction, data is read from address R8 in memory. The read data is written into register R1 at the following W stage. Similarly, data is read from address R9 in memory at M stage of the subsequent instruction and written into register R2 at W stage thereof.

Execution of the third MUL instruction is held at A stage. For this, values in registers R1 and R2 must be ready by the start of this stage. In general, the value in register R2 is not ready until W stage of the second instruction (LD instruction). However, here, this value is extracted from M stage, which is an immediately preceding stage of W stage, via bus 112 (see FIG. 1), and transferred to A stage of MUL instruction as indicated by the arrow a, which is a data forwarding method. In this example, this arrangement is effective in making the A stage of MUL instruction start earlier by one cycle. (Note that forwarding with bus 113 is not related to this invention.)

MULU initiates execution of a multiplication operation at the start of the MUL instruction A stage, and completes it within two clock cycles by the end of M stage. For the last ST instruction, the data forwarding method is also applied (indicated with the arrow b) and data on the result of the multiplication operation is thereby transferred from the end of M stage of MUL instruction to the beginning of A stage of ST instruction. Subsequently, at M stage, that data is stored at address R10 in memory.

In FIG. 2, A stage of MUL instruction starts after completion of M stage of its immediately preceding LD instruction. Thus, a stage for waiting, denoted with (R), is inserted inbetween. Because of this insertion, the following ST instruction cannot progress to its R stage, so that a stage for waiting, denoted with (I), is inserted into the execution for ST instruction. Further, the following A stage of ST instruction must wait until completion of M stage of MUL instruction. This requires another (R) stage to be inserted for waiting. This in turn demands another (I) stage to be inserted for waiting into the execution for XX instruction. If a process period for one multiplication operation is defined as from the beginning of W stage of the initial LD instruction to the beginning of W stage of XX instruction, this microprocessor requires six cycles to complete one multiplication operation. Although there may be other ways to define a process period, the aforementioned definition is natural when the following periods after XX instruction will be similarly defined. This is because a process period headed by XX instruction can be counted, beginning with W stage thereof.

A process for writing a product of two data stored in a memory back into the memory is frequently applied over general signal processing, including image processing, etc. One of the main objects of a RISC microprocessor is to achieve utmost performance in some specific usages. In a macroscopic point of view, six cycles are consumed for executing four instructions in FIG. 2. Of those six cycles, however, one cycle is only for waiting. This waiting cycle is only necessary because one multiplication operation takes two cycles to complete. Thus, in theory, these six cycles can be reduced to five cycles.

One extra cycle is still needed because the MUL instruction A stage must wait until completion of the M stage of the immediately preceding LD instruction. A programming method has been known in order to solve this problem. In this method, two or more multiplication operations are arranged to be grouped together. For instance, if an operation requires processes for writing a product of values stored at addresses R10 and R11 of a memory back into the memory, in addition to the processes shown in FIG. 2, all LD instructions are coded prior to other instructions as follows:

|     |           |
| --- | --------- |
| LD  | R1, (R8)  |
| LD  | R2, (R9)  |
| LD  | R3, (R10) |
| LD  | R4, (R11) |
| MUL | R1, R2    |
| MUL | R3, R4.   |

While the third and fourth LD instructions are executed, a wait stage for the initial MUL instruction becomes unnecessary. Similarly, while the initial MUL instruction is executed, a wait stage for the next MUL instruction also becomes unnecessary. However, this method relies on programming and is not usable in cases when an operation includes only one multiplication, such as is the case shown in FIG. 2. Thus, not only is such programming troublesome, but improvement through such programming is subject to a limit. In actuality, much improvement cannot be expected through programming.

SUMMARY OF THE INVENTION

The present invention has been conceived to overcome the above problems and aims to provide an instruction execution method which eliminates wait stages and an apparatus therefor by reorganizing a hardware structure. This invention provides a method and an apparatus which can constantly achieve improved performance irrespective of processing context, and requires no special programming techniques.

(1) In a first aspect of the present invention, there is provided a method for executing instructions through pipeline processing, wherein, in addition to a main path for pipeline processing, a subpath is provided in a manner of detouring around a part of the main path for assuming a portion of the main path function or processes, the subpath is connected such that processing therein flows in an opposite direction to that in the main path, and a process is entrusted from the main path to the subpath in a later stage of the pipeline processing executed in the main path than a processed result is received by the main path from a subpath.

The "main path" signifies a path formed through the cooperation of various processing units for the basic flow of the pipeline processing. In a conventional instruction execution method, the processing flows in the same direction at a branch from a main path to a subpath as the direction of the processing in the main path. Thus, a processed result obtained in the subpath joins the main path downstream. In this invention, on the other hand, the processing flows in the opposite direction in the subpath. That is, entrustment of a process from the main path to a subpath is done downstream of the receipt of a processed result by the main path from a subpath along the pipeline. As a result, initiation of the processing in the subpath can be delayed so that pipeline processing in the main path can correspondingly progress.

(2) In a second aspect of the present invention, there is provided an apparatus for executing instructions through pipeline processing by dividing them into a plurality of stages comprising a plurality of stage process sections each responsible for processing at each stage, constituting a main path for pipeline processing; and an execution section provided on a subpath for executing a predetermined operation through processing which flows in an opposite direction to that in the main path.

The term "operation" herein is not limited to numerical operations, and signifies in general a unit process of various control functions. An example of the "operation execution unit" is a coprocessor which executes specific operations. A general operation execution unit may be provided on a main path, however, in such a case, it is different from the "operation execution unit" mentioned herein.

In this aspect, each stage process section on the main path executes instructions through pipeline processing. The operation execution unit on a subpath executes a predetermined operation through processing which flows in the opposite direction to that in the main path.

(3) In a third aspect, an apparatus for executing instructions comprises a processor for executing instructions through pipeline processing and a coprocessor for assuming a predetermined operation among processes by the processor, wherein the coprocessor is connected to the processor in an opposite direction such that processing by the coprocessor flows in an opposite direction to that by the processor.

In this aspect, entrustment of an operation, namely, transfer of the content of and data for an operation, from a processor to a coprocessor is done downstream of the point where an operation result is transferred from the coprocessor to the processor. As a result, the start of the processing by the coprocessor can be delayed so that pipeline processing by the processor can correspondingly progress. In addition, an operation result yielded by the coprocessor may be directly given to a memory stage which needs the result.

(4) In a fourth aspect, in an apparatus according to a third aspect, the pipeline processing by the processor includes a memory access stage as one of processing stages, the processor comprises a memory access section for controlling the memory access stage, and a data input unit of the coprocessor and a data output unit thereof are connected to a data output unit of the memory access section and a data input unit thereof, respectively.

In this aspect, a coprocessor can be activated after receiving the result of an access made by the memory access section. In addition, the operation result yielded by the coprocessor may be directly utilized by the memory access section.

(5) In a fifth aspect, in an apparatus according to the fourth aspect, the processor comprises an instruction fetch section, an instruction decode section, a general execution section, a memory access section, and a register write section, each responsible for a corresponding stage of pipeline processing, and a data input unit of the coprocessor and a data output unit thereof are connected to a data output unit of the memory access section and a data input unit thereof, respectively, via dedicated buses.

In this aspect, since the coprocessor can be activated after receiving the result of an access made by the memory access section, the processor does not need to activate the coprocessor at a process stage assigned to a general execution section (e.g., A stage in FIG. 2). Instead, the processor can activate the coprocessor at the following process stage (e.g., M stage in FIG. 2). In addition, since the coprocessor and the memory access section are connected with each other via a dedicated bus, data can be transmitted between them neither being hindered by nor hindering other processing state.

BRIEF DESCRIPTION OF THE DRAWINGS

The above and other objects, features, and advantages, will become further apparent from the following description of the preferred embodiment taken in conjunction with the accompanying drawings wherein.

DESCRIPTION OF THE PREFERRED EMBODIMENTS

Preferred embodiments of the operation execution apparatus of this invention are described here with reference to the drawings. The description of this apparatus also clarifies the operation execution method related to this invention. In the embodiment, a pipeline microprocessor is considered for the operation execution apparatus. A section corresponding to the MULU in the V851 is implemented by a coprocessor.

[Configuration]

Figure 1:
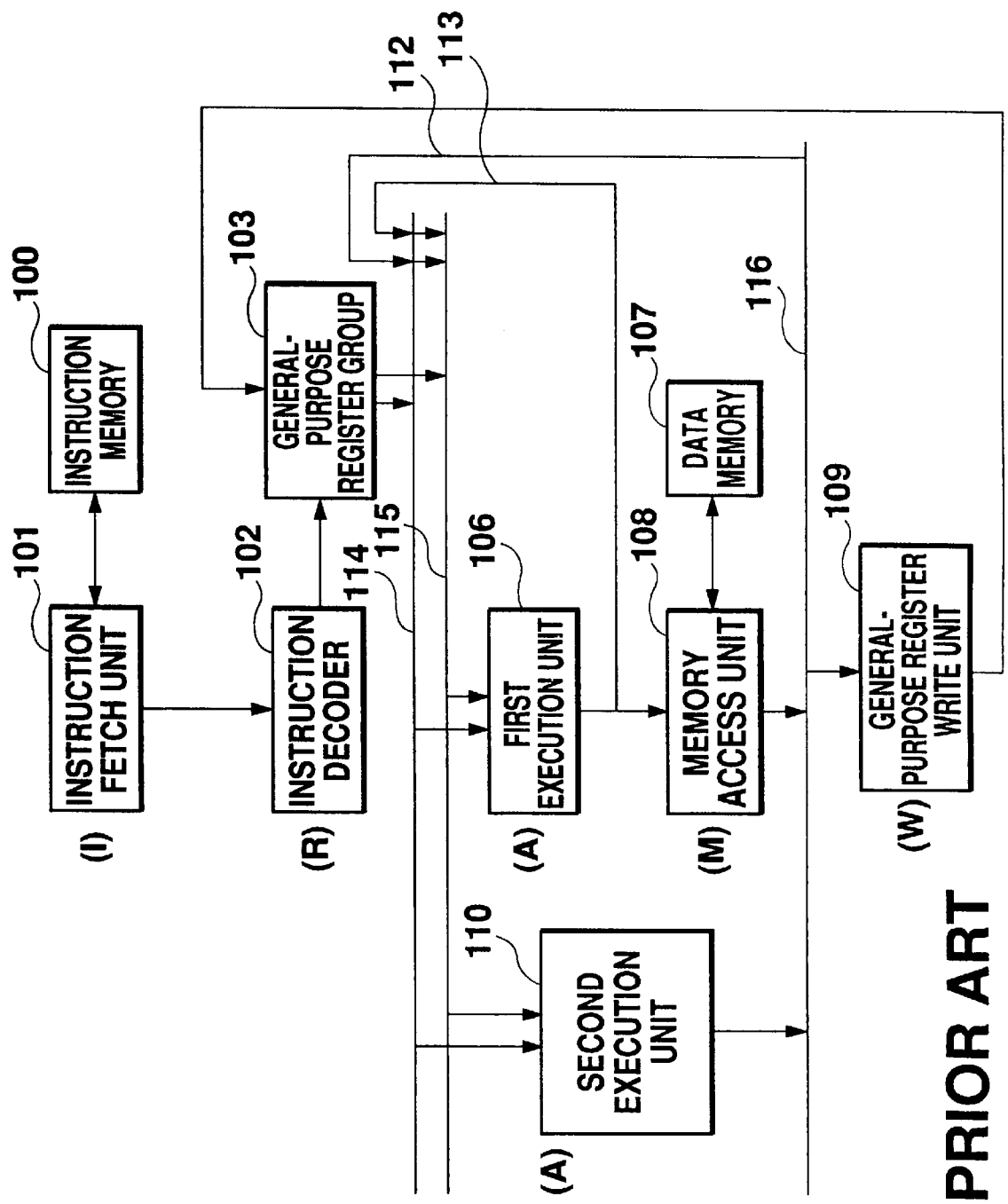
FIG. 1 is a schematic diagram showing an internal organization of a V851.
Figure 3:
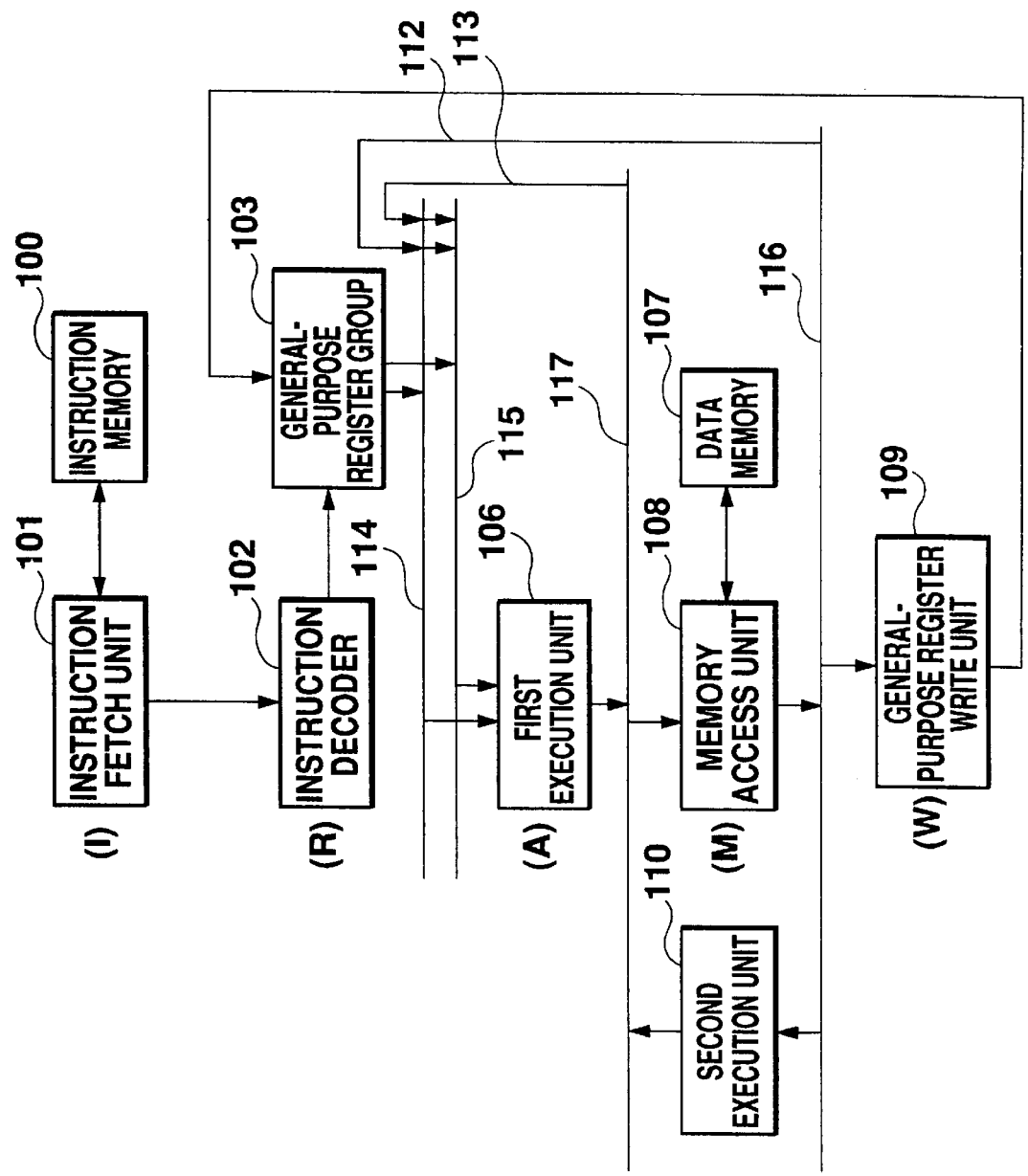
FIG. 3 is a schematic diagram showing an internal organization of an instruction execution apparatus of a preferred embodiment, focusing on relationship among process stages.

FIG. 3 is a schematic diagram showing the internal organization of an operation execution apparatus according to this embodiment. This diagram is presented focusing on the relationship among processing stages. In the diagram, similar or equivalent members to those in FIG. 1 are given the same reference numerals and their explanations are omitted.

The vertical path in FIG. 3 leading from the instruction fetch unit 101 to the general-purpose register write unit 109, which constitutes a main path, is incorporated into a processor. A second execution unit 110, or a coprocessor, is provided in the direction from W stage to A stage on a subpath which detours around a part of the main path. In this apparatus, the second execution unit 110, as well as a memory access unit 108, is connected via a bus 117 behind the first execution unit 106, or an ALU. This structure is essentially different from that shown in FIG. 1 in the direction where second execution unit 110 is connected. To be more concrete, second execution unit 110 is connected in the direction opposite to the flow direction of pipeline processing. That is, the data input of second execution unit 110 is connected to the data output of memory access unit 108, and the data output of second execution unit is connected to the data input of memory access unit 108. Dedicated buses are used for these connections.

With this arrangement, second execution unit 110 can initiate execution of operations upon completion of the processing at A stage. This structure makes a good contrast to that of FIG. 1 in which execution of operations must be initiated at the same time as the start of the processing at A stage.

Figure 4:
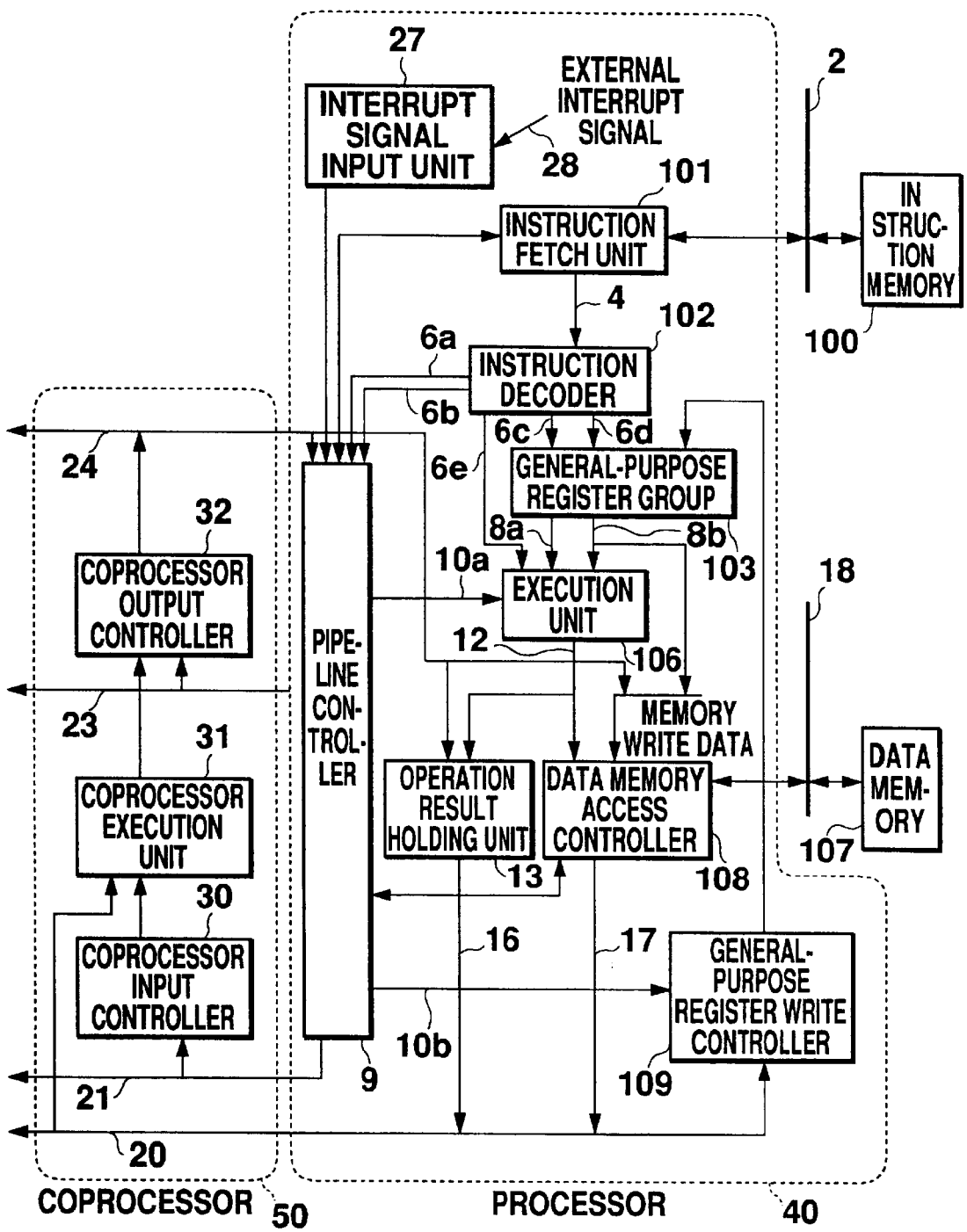
FIG. 4 shows in detail the structure of an apparatus of the preferred embodiment.

FIG. 4 is a block diagram showing an apparatus of this embodiment. A coprocessor 50 corresponds to second execution unit 110.

Processor 40 includes an instruction fetch unit 101 for fetching instructions from instruction memory bus 2 and instruction decoder 102 for receiving and decoding instruction words from instruction fetch unit 101. These units correspond to stage I and the first half of stage R.

At instruction decoder 102, an instruction word 4 is decoded according to the type of instruction, and items are extracted including a function code 6a indicating the function of the operation to be processed, immediate operand 6e which is a constant operand embedded in the instruction word, two source register numbers 6c and 6d, one destination register number 6b, and so forth.

Source register numbers 6c and 6d are sent to general-purpose register group 103. In this embodiment, the registers in general-purpose register group 103 are named R0, R1, etc. The contents of registers corresponding to source register numbers 6c and 6d are fetched from general-purpose register group 103 and sent to a first execution unit 106 as source operand 8a and 8b. Buses to be used for the above correspond to the buses 114 and 115 of FIG. 3. This represents the second half of the stage R. The first execution unit 106 is responsible for the processing at A stage.

On the other hand, function code 6a is sent to a pipeline controller 9. As shown in the same figure, the pipeline controller 9 monitors the state of the entire apparatus, controls stage progress, and decides the issuance timing for the individual instructions. Issuance of instructions means here to progress the processing from R stage to A stage, and generally to progress to a stage which may change the state of hardware.

When it becomes possible for an instruction to be issued, function code 6a is sent as a function code 10a to a first execution unit 106. At the first execution unit 106, an operation is performed according to function code 10a furnished from pipeline controller 9 using necessary values from among source operand 8a and 8b obtained from the general-purpose registers and immediate operand 6e. The significance of such an operation differs depending on the type of instruction.

If the instruction is an operation instruction, for example, the operation indicated by the instruction is executed by the first execution unit 106. The operation result is stored into an operation result holding unit 13. An operation result 16 is sent to general-purpose register group 103 through a general-purpose register write unit 109. At this time, as a register number of the write designation, destination register number 6b of the instruction is sent out as a destination register number 10b at the appropriate timing by pipeline controller 9. General-purpose register write unit 109 performs a write operation to the general-purpose register using destination register number 10b that was obtained from pipeline controller 9. This corresponds to stage W. In this case, stage M corresponds to NOP where nothing is performed.

On the other hand, if the instruction being executed is a memory access instruction, a calculation of the memory address to be accessed is executed at the first execution unit 106. A memory address 12 that is obtained is passed to a data memory access section 108. Data memory access section 108 performs reading and writing of data memory 107 through data memory bus 18. This corresponds to stage M. The execution of an instruction to write into memory is completed by an execution in data memory access section 108. In this case, stage W corresponds to NOP. The execution of an instruction to read from memory completes when data 17 that was read is written to the general-purpose register through general-purpose register write unit 109, namely, at the same time when stage W completes.

Processor 40 further includes an interrupt signal input unit 27 for inputting an external interrupt signal 28. When an interrupt signal is input, pipeline controller 9 is notified of the input.

On the other hand, coprocessor 50 performs data transfers with processor 40 through buses, namely, a coprocessor input bus 20 including operation result 16 in processor 40 and data 17 that was read from data memory 107 (corresponding to a part of the bus 116 in FIG. 3), a coprocessor input control bus 21 including signals to control inputs, such as of data, to coprocessor 50, a coprocessor output control bus 23 including signals to control outputs from coprocessor 50, and a coprocessor output bus 24 including operation result data and state signals that were output from the coprocessor (corresponding to a part of the bus 117 in FIG. 3).

Coprocessor input bus 20 and coprocessor input control bus 21 are referred at a coprocessor input controller 30. Coprocessor input controller 30 determines into which register in coprocessor 50 data should be input as well as avoiding an input overflow of data to coprocessor 50.

A coprocessor execution unit 31 performs an operation when coprocessor input controller 30 accepts a data input. The operation result is supplied to a coprocessor output controller 32 and stored in an output register. Coprocessor output controller 32 references coprocessor output control bus 23, determines a register to which data should be output, and controls the output of data from the register. The data that is output is supplied to processor 40 through coprocessor output bus 24. Coprocessor output controller 32 further outputs the condition of the operation execution and the state of the data input overflow judged in coprocessor input controller 30 to coprocessor output bus 24, and offers information to pipeline controller 9 in processor 40 necessary for a stage progress halt, a cancellation of an instruction, or the like.

Figure 5:
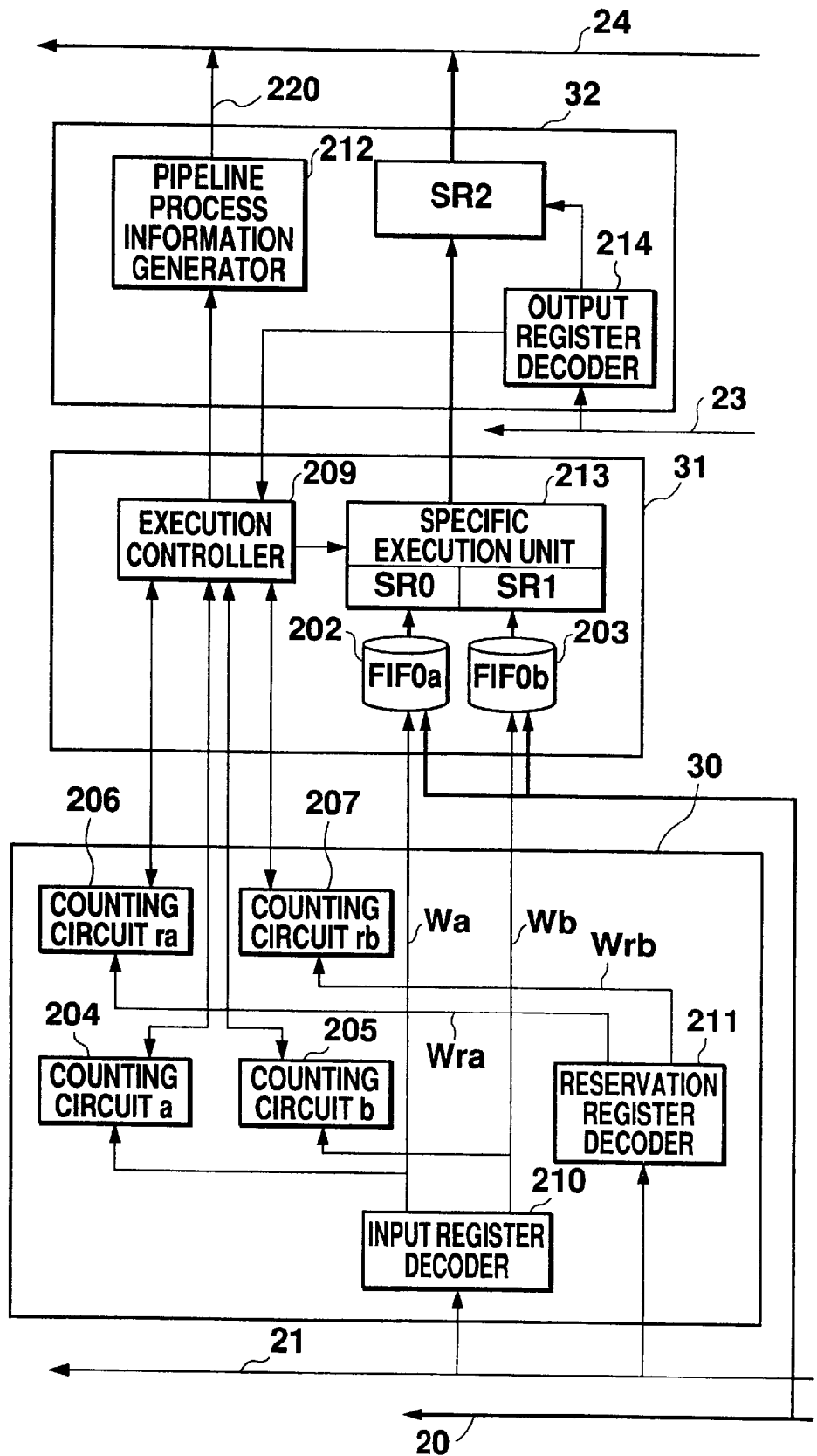
FIG. 5 is a schematic diagram showing an internal organization of a coprocessor of the preferred embodiment.

FIG. 5 shows the internal organization of coprocessor 50. In this figure, a specific execution unit 213 within coprocessor execution unit 31 is the one that performs operations and the execution of operations is controlled by an execution controller 209. Specific execution unit 213 performs operations specific to the coprocessor (mainly dyadic operations) such as floating-point arithmetic, in addition to ordinary multiplication and division operations. Data on which operations are to be performed is supplied to specific execution unit 213 by two input registers SR0 and SR1, which are provided together with specific execution unit 213. Operation results are stored by an output register SR2 within coprocessor output controller 32. Output register SR2 outputs operation results to coprocessor output bus 24. Although the output register is shown here as a single unit, there may be a multiple number of units, in which case an output register decoder 214 selects a register that is to output data to the bus. In this embodiment, FIFOa 202 and FIFOb 203 are provided in front of input registers SR0 and SR1, respectively. They are connected directly to coprocessor input bus 20, and can store data supplied from processor 40. When processor 40 commands the coprocessor to execute an operation, an input register decoder 210 decides to which one of the input register SR0 or SR1 data should be input. This decision is performed by input register decoder 210 looking at a coprocessor register number that was placed on coprocessor input control bus 21. A write command signal Wa or Wb is output from input register decoder 210 to the FIFO where data is to be input, at which time the data that was placed on coprocessor input bus 20 is written to FIFOa 202 or FIFOb 203. Specific execution unit 213 fetches data from FIFOa 202 and FIFOb 203 each time an operation being executed completes, and starts a new dyadic operation.

The overall path in coprocessor 50 of the FIFO stage, input registers SR0 and SR1, specific execution unit, and output register SR2 comprises a pipeline having a FIFO structure. Processing in this pipeline has a certain synchronous relationship with the stages in the pipeline at processor 40.

In FIG. 5, counting circuits a 204 and b 205 are counters for incrementing count values when the aforementioned respective write command signals Wa and Wb are output. When output register decode 214 commands the output of data SR2, these counting circuits are notified of this through arithmetic controller 209 and decrement the count values. Therefore, these counting circuits indicate numbers of data items stored in FIFOa 202 and FIFOb 203, respectively, and are referenced by optical circuits (not shown) for optical purpose.

On the other hand, counting circuits ra 206 and rb 207 are counters for incrementing count values according to write command signals Wra and Wrb from a reservation register decoder 211, respectively, and decrementing count values under conditions similar to those for the aforementioned counting circuits a 204 and b 205. In this embodiment, data writing to coprocessor 50 is performed at stage W, which is the last stage of an instruction. Thus, even if there are empty areas in FIFOa 202 and FIFOb 203 at the A stage of the following instruction, those areas may be filled in the W stage of the previous instruction. A reservation operation is therefore useful and necessary in order to correctly know the state of empty A stage areas.

Write command signals Wra and Wrb are output from reservation register decoder 211 when an instruction decoded by instruction decoder 102 in processor 40 announces in advance write operations for SR0 and SR1, respectively. Therefore, the number of increments in counting circuits ra 206 and rb 207 is, as a result, the same as that in counting circuits a 204 and b 205, but with earlier increment timing. The counter values of counting circuits ra 206 and rb 207 indicate sums of the number of data items actually stores in FIFO a 202 and b 203 and the number of data items to be stored in the near future. If specific execution unit 213 always performs dyadic operations, one of either counting circuit a 204 or b 205 is sufficient. However, to implement operations where a value of SR0 is successively added to the operation result, it is necessary to separately include both counting circuits.

Coprocessor output controller 32 further includes a pipeline process information generator 212. Pipeline process information generator 212 outputs a coprocessor ready signal (hereinafter simply "ready signal") 220. A ready signal 220 is a signal used for processor 40 to perform handshaking for processing with coprocessor 50 and is output under the following conditions:

1. Data transfer to SR0

Taking reservations also into consideration, when the value of counting counter ra 206 is smaller than the number of data items that can be stored in FIFO a 202.

2. Data transfer to SR1

Similarly, when the value of counting circuit rb 207 is smaller than the number of data items that can be stored in FIFO b 203.

3. Data reading from SR2

When an operation result is present in the output register.

When a ready signal is output, processor 40 issues any one of the above 1–3 instructions which has been made to wait.

[Operations]

The operation according to the aforementioned structure will be described focusing on the operation related to coprocessor 50.

Figure 6:
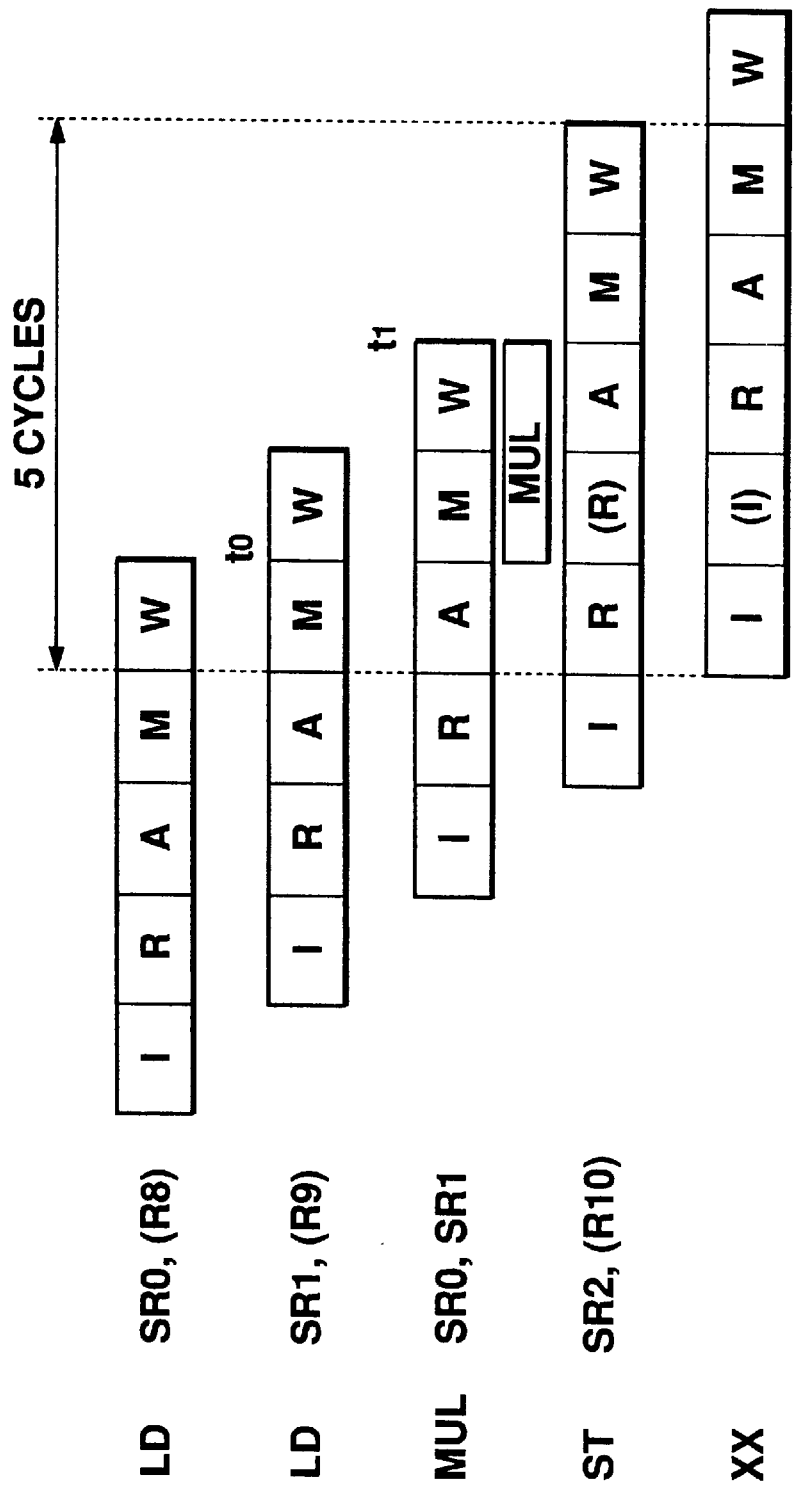
FIG. 6 shows a state of pipeline processing by an apparatus of the preferred embodiment.

FIG. 6 shows a state of pipeline processing by the present apparatus. Similar to FIG. 2, four instructions are necessary to execute one multiplication operation, which is completed in two cycles. This process is different from that shown in FIG. 2 in that SRs 0 and 1 are used as operation registers in lieu of general-purpose registers because coprocessor 50 executes multiplication operations in this apparatus.

Figure 2:
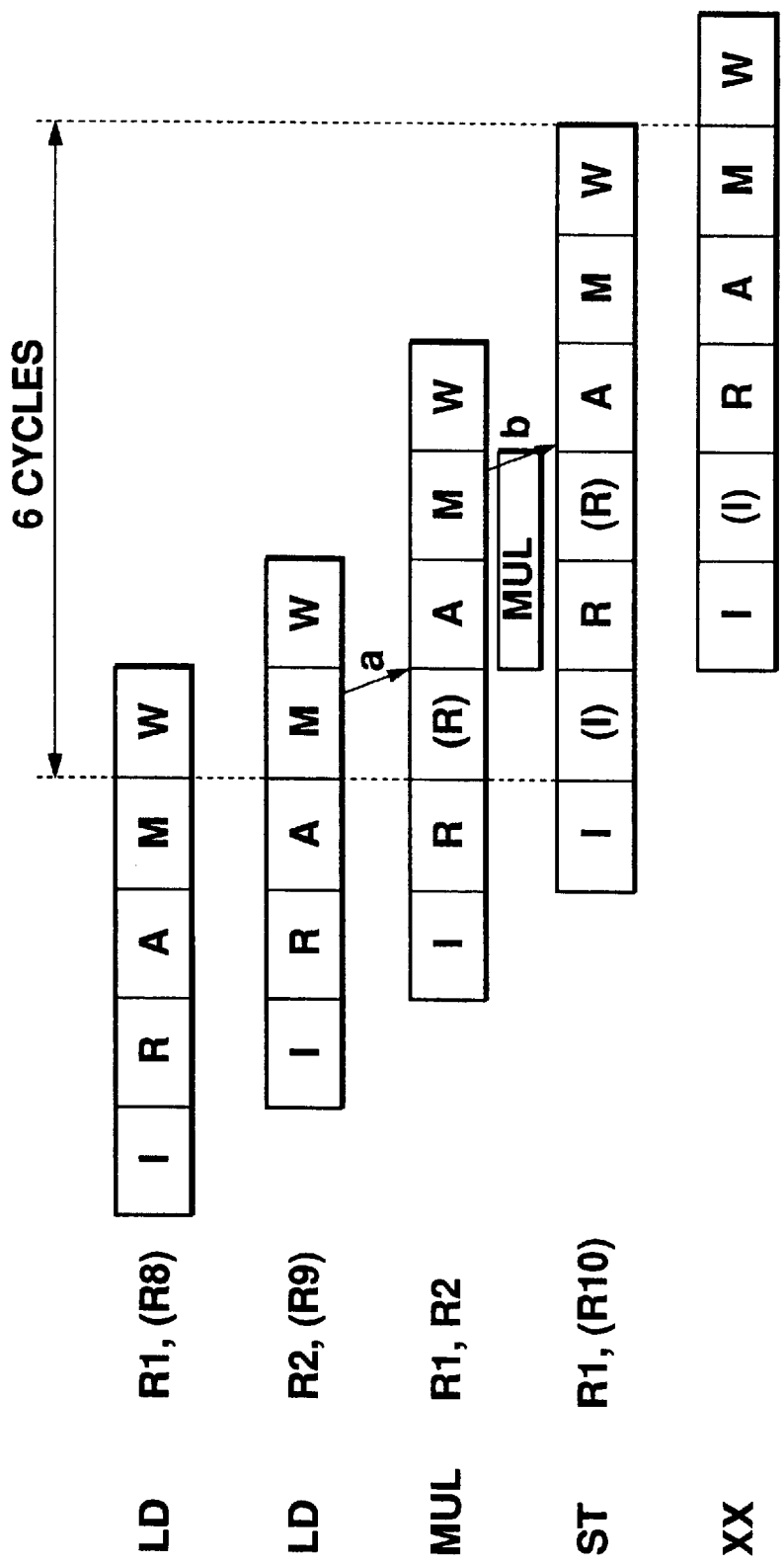
FIG. 2 shows a state of pipeline processing by a general microprocessor employing the structure shown in FIG. 1.

Two LD instructions in FIG. 6 may appear to be processed similarly as in the case of FIG. 2. However, this apparatus is different from that related to FIG. 2 in that writing of operation data into SRs 0 and 1 can be started upon completion of M stage (time t0 in FIG. 6) since data which has been read from memory at M stage are intact input to coprocessor 50.

Following LD instructions, a MUL instruction is executed. As mentioned above, coprocessor 50 can start execution of multiplication operations concurrently at the start of M stage in this apparatus. Thus, A stage of MUL instruction can start without waiting till time t0 by when all operation data become available. This allows respective I-A stages to start without a wait stage inserted. Execution of a multiplication operation is started at the start of M stage, and completes before two stages will have passed, namely, completion of W stage. Note that stages for pipeline processing are actually initiated late in this apparatus compared to the prior art, but initiation timing viewed in absolute time is not delayed. That is, execution of operations starts at the sixth cycle counted from I stage of the initial LD instruction in both cases of FIGS. 2 and 6, and initiation times of the operations are kept the same.

A subsequent ST instruction will be processed as follows. Data read from SR2 is stored into address R10 in memory at M stage of ST instruction. M stage must wait until W stage of MUL instruction, namely, multiplication operation, is completed. In FIG. 6, M stage is processed in the cycle following W stage (starting at time t1). The location of A stage is determined based on the location of M stage. As for ST instruction, it is always necessary to insert one wait stage before M stage (because two cycles are necessary for one multiplication operation to complete). In this example, a wait cycle is inserted as a prolonged R stage. Which of the R or A stage is prolonged to create a wait stage depends on the apparatus design. In either case, an extra stage is created for waiting before a following XX instruction so that multiplication processing is completed in five cycles in total.

The above has been an overview of the embodiment. However, the improvements or modifications given below are possible for the embodiment.

(1) The operations by coprocessor 50 are not limited to such ordinary operations as monadic operations, and product and sum operation. For example, operations apart from numerical operations may be assigned to coprocessor 50, such as control of communications with peripheral devices and communication control between processors in a multi-processor apparatus.

(2) A five-stage pipeline was described here. However, the pipeline may comprise any number of stages and any of the processing stages.

(3) Although a RISC processor was given in this embodiment as an example, a CISC or other architecture may of course be used instead.

Figure 7:
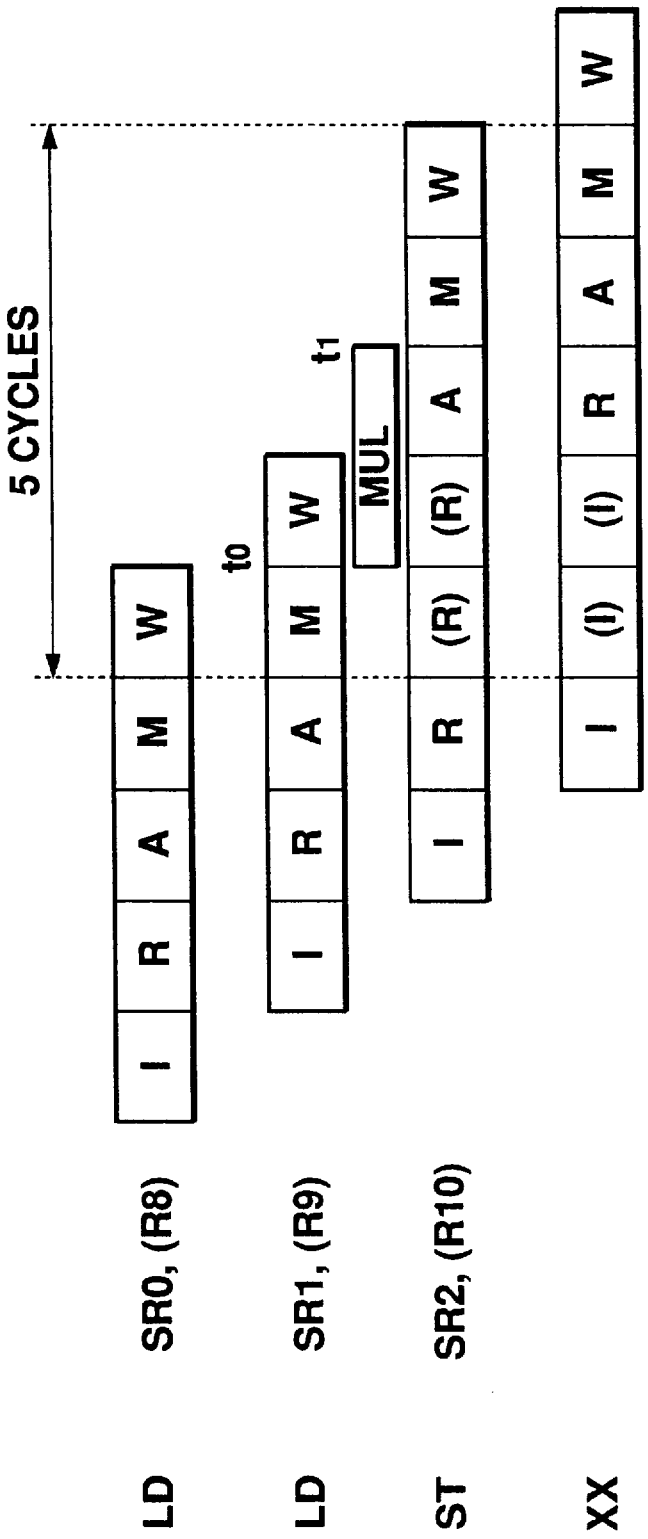
FIG. 7 shows a state of executing the same operation as that in FIG. 6 without a MUL instruction.

(4) Although coprocessor 50 is explicitly activated by a MUL instruction to execute operations in this embodiment, it may be activated implicitly. That is, since coprocessor 50 comprises dedicated input registers SR1 and SR0 apart from general-purpose register group 103, coprocessor 50 may automatically start execution of operations when these two registers receive necessary data. FIG. 7 shows a state of executing the same operation as that shown in FIG. 6 without using a MUL instruction. In this diagram, multiplication operation itself is executed between time t0–t1, and M stage of ST instruction starts at T1, similarly to the case of FIG. 6. In order to meet the above condition, two stages are inserted for waiting during execution of ST instruction, so that the entire operation execution processing is resultingly completed in five cycles, similarly to the case of FIG. 6.

What is claimed is:

1. A computer system for executing instructions through pipeline processing in which the execution of each instruction is divided into a plurality of stages, comprising:

a first execution section forming a main path for executing an instruction in a pipeline manner, said first execution section including a plurality of stage process sections each for processing a stage of execution, the plurality of sections connected in series; and a second execution section forming a subpath for processing an instruction, the subpath connected to the main path in parallel with one or more of the plurality of sections forming the main path, wherein the processing in the subpath and the processing in the main path flow in opposite directions.

2. The computer system of claim 1, wherein the sections forming the main path are included in a processor and the second execution section is included in a coprocessor.

3. The computer system of claim 1, wherein the second execution section executes a predetermined operation.

4. The computer system of claim 1, wherein the plurality of sections forming the main path include a memory access section having an input unit and an output unit, and wherein the second execution section has an input unit connected to the output unit of the memory access section and an output unit connected to the input unit of the memory access section.

5. The computer system of claim 4, wherein the plurality of sections forming the main path further include an instruction fetch section, an instruction decode section, and a general execution section connected in that order before the memory access section, and a register write section connected after the memory access section in the main path.

6. The computer system of claim 5, wherein the subpath executes a multiplication process in five clock cycles, when the second execution section executes multiplication operation.

7. The computer system of claim 5, wherein the main path transfers data to the subpath after the memory access section completes processing its corresponding stage, and receives data from the subpath after the general execution section completes processing its corresponding stage.

8. The computer system of claim 4, wherein the subpath is initiated to execute a predetermined operation during an M (memory access) stage of an operation initiation instruction which is executed by the main path.

9. The computer system of claim 5, wherein the subpath is initiated to execute a predetermined operation during a W (register write) stage of an operation initiation instruction which writes data to the subpath.

10. The computer system of claim 1, wherein the process in the subpath is initiated by an explicit instruction from the main path.

11. The computer system of claim 1, wherein the process in the subpath is initiated automatically upon receipt of necessary input data from the main path.

12. The computer system of claim 1, wherein the subpath outputs process results to the main path, the results flowing in the main path in the same direction as the flow of processing in the main path.

13. The computer system of claim 1, wherein the main path further comprises a pipeline controller for controlling the processing of the execution stages and the initiation of processing in the subpath.

14. The computer system of claim 13, wherein the subpath further comprises a specific execution section for performing arithmetic operations, a plurality of input registers connected to the specific execution section for supplying data to the specific execution section, a plurality of FIFOs each connected between the main path and an input register for receiving data from the main path, and an output register connected between the specific execution section and the main path for outputting the operation results to the main path, wherein the FIFOs, the input registers, the specific execution section and the output register form a pipeline structure having a FIFO structure.

15. The computer system of claim 14, wherein the subpath further comprises an execution controller for controlling the execution of the specific execution section, and counting circuitry receiving information from the pipeline controller in the main path and from the execution controller for recording the number of data items stored in the FIFOs as well as the number of data items to be stored in the FIFOs in a predetermined time period in the future, whereby the main path is able to reserve the storage spaces in the FIFOs.

16. A computer system comprising:

a processor for executing instructions through pipeline processing; and a coprocessor for assuming a predetermined operation of the processing of the processor, the coprocessor connected to the processor between a first point and a second point in the processor;

wherein the processing of instructions in the processor flows from the first point to the second point and the processing in the coprocessor flows from the second point to the first point.

17. A method in a computer system for executing instructions through pipeline processing in which the execution of each instruction is divided into a plurality of stages, comprising:

sequentially processing each stage of the execution through a stage process section in the computer system in a pipeline manner, the plurality of stage process sections forming a main path;

for at least one instruction, entrusting the execution process from the main path to a subpath;

processing an instruction in the subpath; and receiving the process result from the subpath by the main path at a point in the main path upstream from the point at which the process is entrusted from the main path to the subpath.

18. The method of claim 17, further comprising the step of processing an instruction by a stage process section in the main path located downstream from the point at which the process result is received from the subpath using the received results.

19. The method of claim 17, wherein the processing steps in the main path are executed by a processor, and wherein the processing step in the subpath is executed by a coprocessor.

20. The method of claim 17, further comprising reserving the hardware resources of the subpath by the main path before entrusting a process from the main path to the subpath.

* * * * *